United States Patent
Lastras-Montano

(10) Patent No.: US 8,261,174 B2
(45) Date of Patent: Sep. 4, 2012

(54) PROTECTING AND MIGRATING MEMORY LINES

(75) Inventor: Luis A. Lastras-Montano, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 881 days.

(21) Appl. No.: 12/352,744

(22) Filed: Jan. 13, 2009

(65) Prior Publication Data

US 2010/0180179 A1 Jul. 15, 2010

(51) Int. Cl.
*G06F 11/00* (2006.01)

(52) U.S. Cl. .................................................. 714/799

(58) Field of Classification Search .................. 714/759, 714/799

See application file for complete search history.

(56) References Cited

U.S. PATENT DOCUMENTS

| | | | | |
|---|---|---|---|---|
| 5,200,962 A * | 4/1993 | Kao et al. | | 714/774 |
| 5,490,260 A * | 2/1996 | Miller et al. | | 711/100 |
| 5,875,280 A * | 2/1999 | Takaiwa et al. | | 386/224 |
| 6,775,751 B2 * | 8/2004 | Tremaine | | 711/154 |
| 7,120,727 B2 | 10/2006 | Lee et al. | | |
| 7,340,666 B1 * | 3/2008 | Wright et al. | | 714/774 |
| 7,437,492 B2 * | 10/2008 | Stager et al. | | 710/68 |
| 7,437,597 B1 * | 10/2008 | Kruckemyer et al. | | 714/6.11 |
| 7,650,457 B2 * | 1/2010 | Ruckerbauer | | 711/5 |
| 8,117,381 B2 * | 2/2012 | Gonzalez et al. | | 711/103 |
| 8,135,903 B1 * | 3/2012 | Kan | | 711/103 |
| 8,140,744 B2 * | 3/2012 | Gaertner | | 711/112 |
| 2006/0168407 A1 | 7/2006 | Stern | | |
| 2006/0215434 A1 | 9/2006 | Lee et al. | | |
| 2007/0058410 A1 * | 3/2007 | Rajan | | 365/63 |
| 2008/0109595 A1 | 5/2008 | Rajan et al. | | |
| 2008/0140952 A1 | 6/2008 | Lee et al. | | |
| 2009/0070651 A1 * | 3/2009 | Diggs et al. | | 714/752 |
| 2009/0193221 A1 * | 7/2009 | Reid | | 711/202 |
| 2010/0293436 A1 * | 11/2010 | Coteus et al. | | 714/763 |

* cited by examiner

*Primary Examiner* — Scott Baderman
*Assistant Examiner* — Neil Miles
(74) *Attorney, Agent, or Firm* — Cantor Colburn LLP

(57) ABSTRACT

A data protection method is provided. The method includes receiving data; generating compressed data based on the data; determining a degree of compressibility based on the compressed data; determining an amount of free space based on the degree of compressibility; and setting one or more error bits based on the amount of free space.

12 Claims, 9 Drawing Sheets

PROTECTING AND MIGRATING MEMORY LINES

BACKGROUND

The present invention relates to computer memory, and more specifically, to systems, methods, and computer program products for storing lines of memory to protect the data content when the memory has physical failures.

Prior to storing lines of data in memory, the data can be processed by a compression engine. The compression engine compresses the data according to one or more compression techniques known in the art. The size of the compressed data can vary based on the compression techniques and the data to be compressed. The compressed data is stored in a line of memory.

SUMMARY

In an exemplary embodiment, a data protection method is provided. The method includes: receiving data; generating compressed data based on the data; determining a degree of compressibility based on the compressed data; determining an amount of free space based on the degree of compressibility; and setting one or more error control bits based on the amount of free space.

In other exemplary embodiments, a data protection system is provided. The system includes: a compression module that receives data to be stored in memory, and that generates compressed data based on the data; a format field generator module that determines a degree of compressibility based on the compressed data, and that determines an amount of free space based on the degree of compressibility; and an error bit generator module that sets one or more error control bits based on the amount of free space.

Additional features and advantages are realized through the techniques of the present disclosure. Other embodiments and aspects of the disclosure are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

The drawings described herein are for illustration purposes only and are not intended to limit the scope of the present disclosure in any way. It should be understood that throughout the drawings, corresponding reference numerals indicate like or corresponding parts and features.

DETAILED DESCRIPTION

Figure 1:
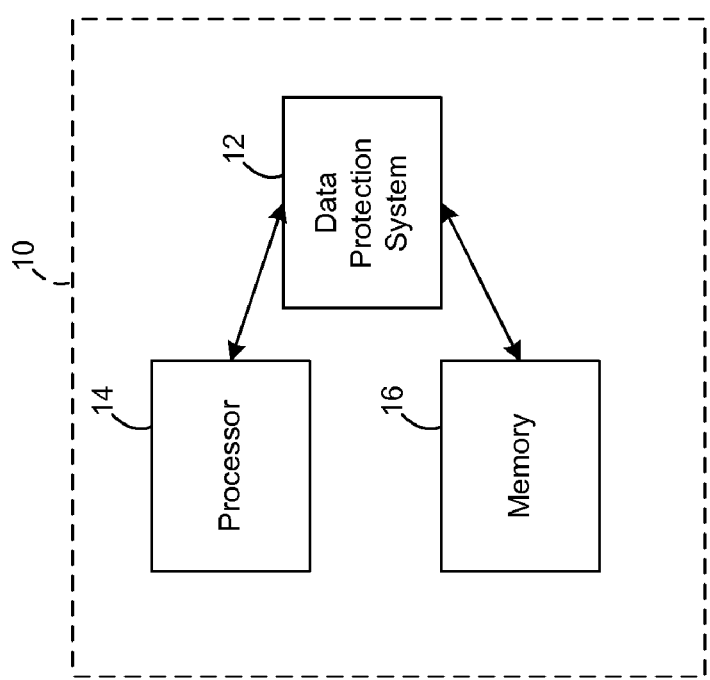
FIG. 1 is a block diagram illustrating a computing system that includes a data protection system in accordance with an exemplary embodiment.

Turning now to FIG. 1, a block diagram illustrates an exemplary computing system 10 that includes a data protection system 12 in accordance with the present disclosure. The computing system 10 is shown to include a processor 14 and memory 16. In various embodiments, the memory 16 stores instructions that can be executed by the processor 14 and/or data resulting from the processed instructions. The instructions stored in the memory 16 may include one or more separate programs, each of which comprises an ordered listing of executable instructions for implementing logical functions. In the example of FIG. 1, the instructions stored in the memory 16 include at least the data protection system 12 of the present disclosure.

When the computing system 10 is in operation, the processor 14 is configured to execute the instructions stored within the memory 16, to communicate data to and from the memory 16, and to generally control operations of the computing system 10 pursuant to the instructions. The processor 14 can be any custom made or commercially available processor, a central processing unit (CPU), an auxiliary processor among several processors associated with the computing system 10, a semiconductor based microprocessor (in the form of a microchip or chip set), a macroprocessor, or generally any device for executing instructions.

In various embodiments, the computing system 10 of FIG. 1 can be implemented as one or more modules. As used herein, the term module and/or sub-module refers to an electronic circuit, a processor (shared, dedicated, or grouped) and memory that execute one or more software or firmware programs, a combinational logic circuit, and/or other suitable components that provide the described functionality.

Figure 2:
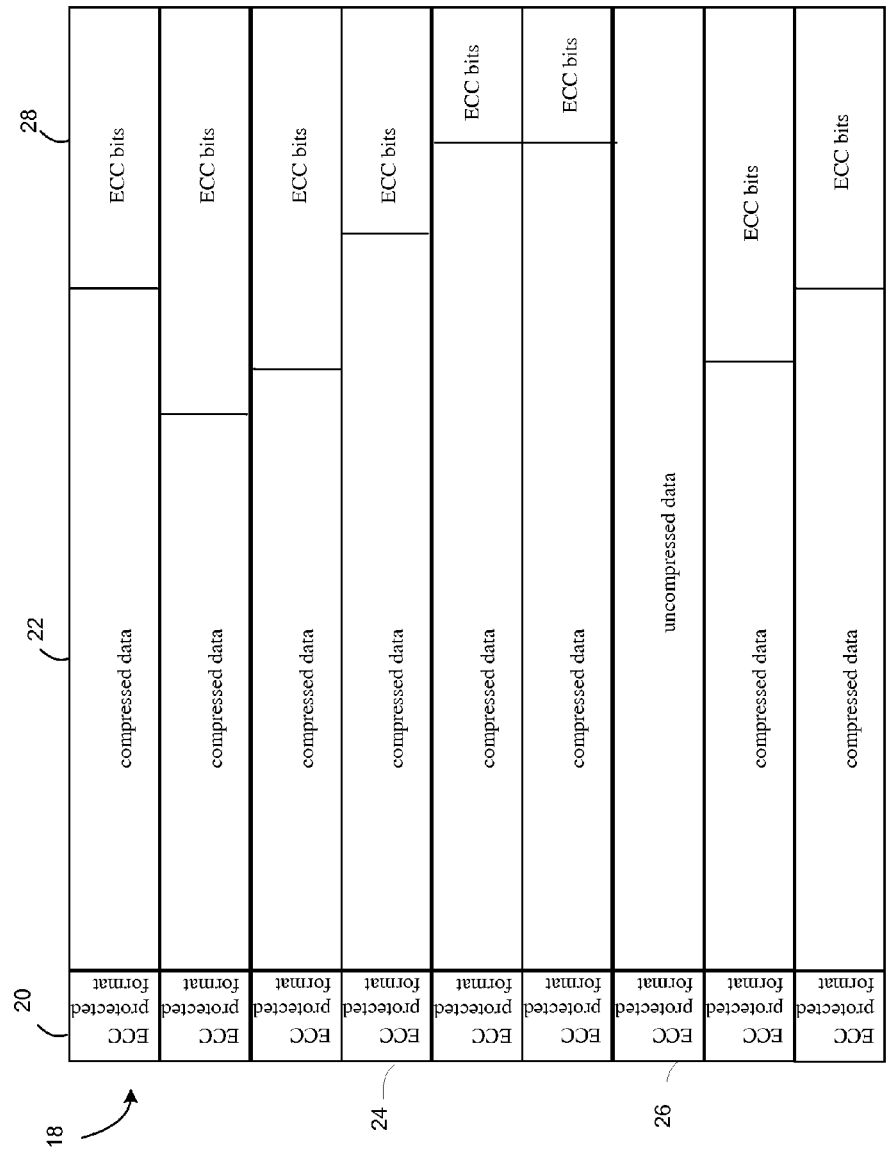
FIG. 2 is a block diagram illustrating lines of data of the data protection system in accordance with an exemplary embodiment.

In various embodiments, the data protection system 12 provides error detection and correction mechanisms for each line of data that is to be stored in the memory 16 based on a compressibility of the data. For example, as shown in FIG. 2, the data protection system 12 (FIG. 1) generates a line of data 18 that includes an error control code (ECC) protected format field 20 and data 22 that has been compressed to a varying degree. For example, at line 24 the data is compressed, and at line 26 the data is not compressed at all. The act of compressing the line potentially frees a certain amount of space within the line of data 18 that the data protection system 12 (FIG. 1) uses to store a variable number of additional error control bits 28, as will be discussed in more detail below. The additional ECC bits 28 improve the number of errors that can be corrected, the number of errors that can be detected, and the resistance of the code to miss-corrections. In various embodiments, an indication of the number of ECC bits 28 that are included in the line of data 18 is encoded in the protected format field 20.

Figure 3:
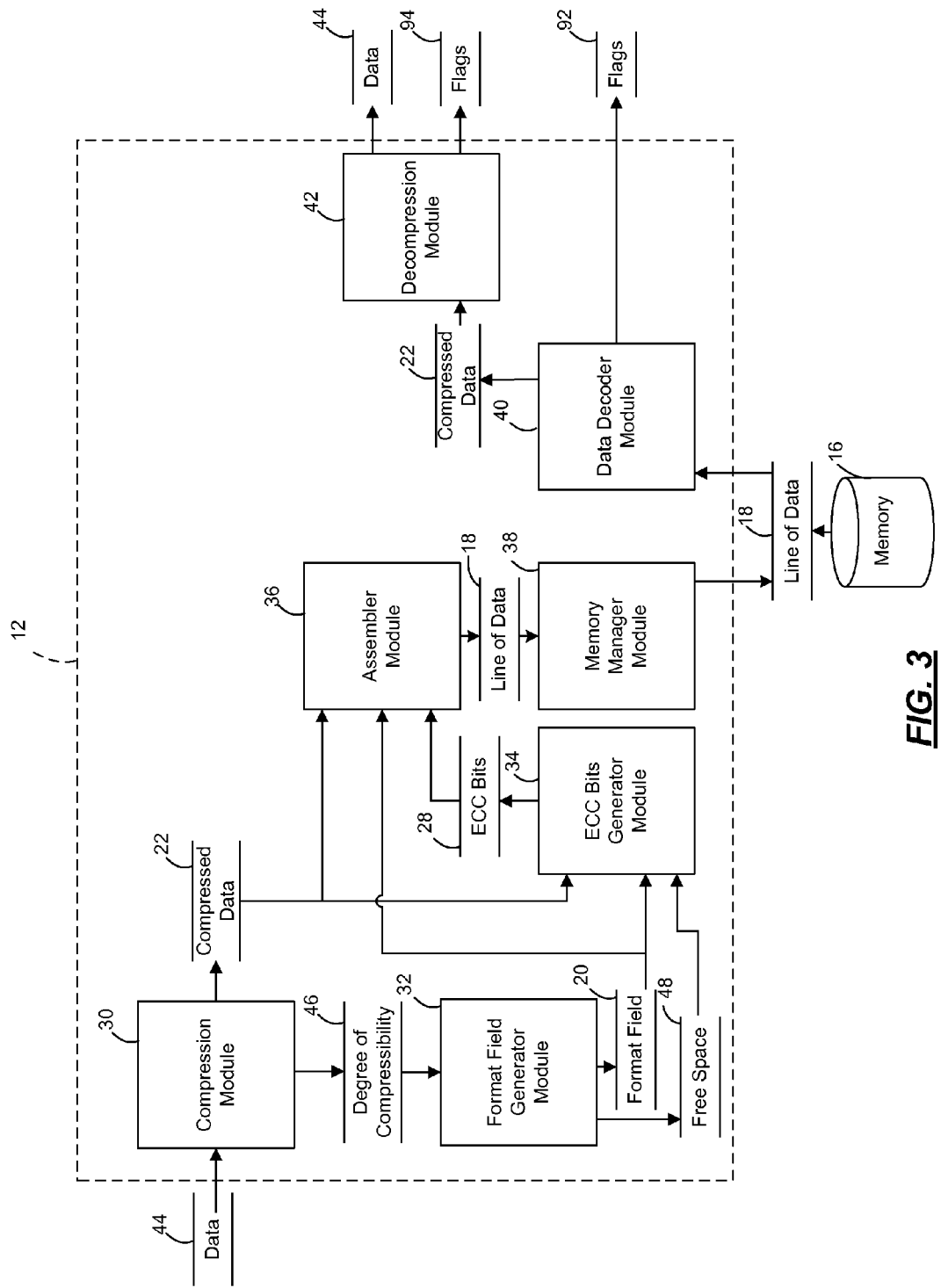
FIG. 3 is a dataflow diagram illustrating the data protection system in accordance with an exemplary embodiment.

Turning now to FIG. 3, the data protection system 12 of FIG. 1 is shown in more detail in accordance with an exemplary embodiment. In various embodiments, the data protection system 12 includes one or more sub-modules. As can be appreciated, the sub-modules shown in FIG. 3 can be combined and/or further partitioned to similarly store and protect data in the memory 16. In this example, the data protection system 12 includes a compression module 30, a format field generator module 32, an ECC bit generator module 34, an assembler module 36, a memory manager module 38, a data decoder module 40, and a decompression module 42.

The compression module 30 receives as input data 44 that is to be stored in the memory 16. The compression module 30 generates the compressed data 22 by compressing the data 44 according to one or more compression techniques known in the art. The compression module 30 then generates a degree of compressibility 46 by evaluating the compressed data 22 to determine the size of the compressed data 22.

The format field generator module 32 receives as input the degree of compressibility 46. Based on the degree of compressibility 46, the format field generator module 32 generates the format field 20. The format field 20 is a protected field that includes one or more ECC bits and an indicator of free space 48 in the line due to the act of compressing the data 44. In order to keep the format field 20 small, the ECC bits may be allocated as a multiple of an integer number of bits that can range from one (highest granularity) to an integer that can be variably chosen.

The ECC bit generator module 34 receives as input the compressed data 22, the indicator of free space 48, and the format field 20. The error bit generator module 34 generates the ECC bits 28 for both the format field 20 and the compressed data 22 according to the indicator of free space 48. The ECC bits 28 are provided to further protect the data 44 based on one or more error control code methods known in the art.

In one example, if an uncompressed line together with the ECC protected format field 20 occupies 'n' symbols, where each symbol is comprised of 'c' bits (so that each symbol can be regarded as an element of GF ($2^c$)), then the compressed line occupies 'n–k' symbols, where a total of 'k' check symbols are generated. It is assumed that n<$2^c$ so that a Reed-Solomon code of length 'n' with symbols in GF ($2^c$) exists. Letting 'a' be a primitive element of GF ($2^c$), the check matrix, when a total of 'k' check symbols are to be produced, is given by:

$$H = [111 \ldots 11 aa \wedge 2 \ldots a \wedge (n-1)1a^{\wedge}2a \wedge 4 \ldots a \wedge (2(n-1))$$
$$\ldots 1 \ a \wedge (k-1) \ a \wedge (2(k-1))a \wedge ((n-1)(k-1))].$$

Choosing the parity check matrix in this manner for every 'k' ensures that the associated code has minimum distance k+1. The minimum distance is an important parameter that determines the error correction and detection capabilities of the code.

The assembler module 36 receives as input the format field 20, the compressed data 22, and the ECC bits 28. The assembler module 36 assembles the received data into lines of data 18, for example, as shown in FIG. 2.

Figure 4:
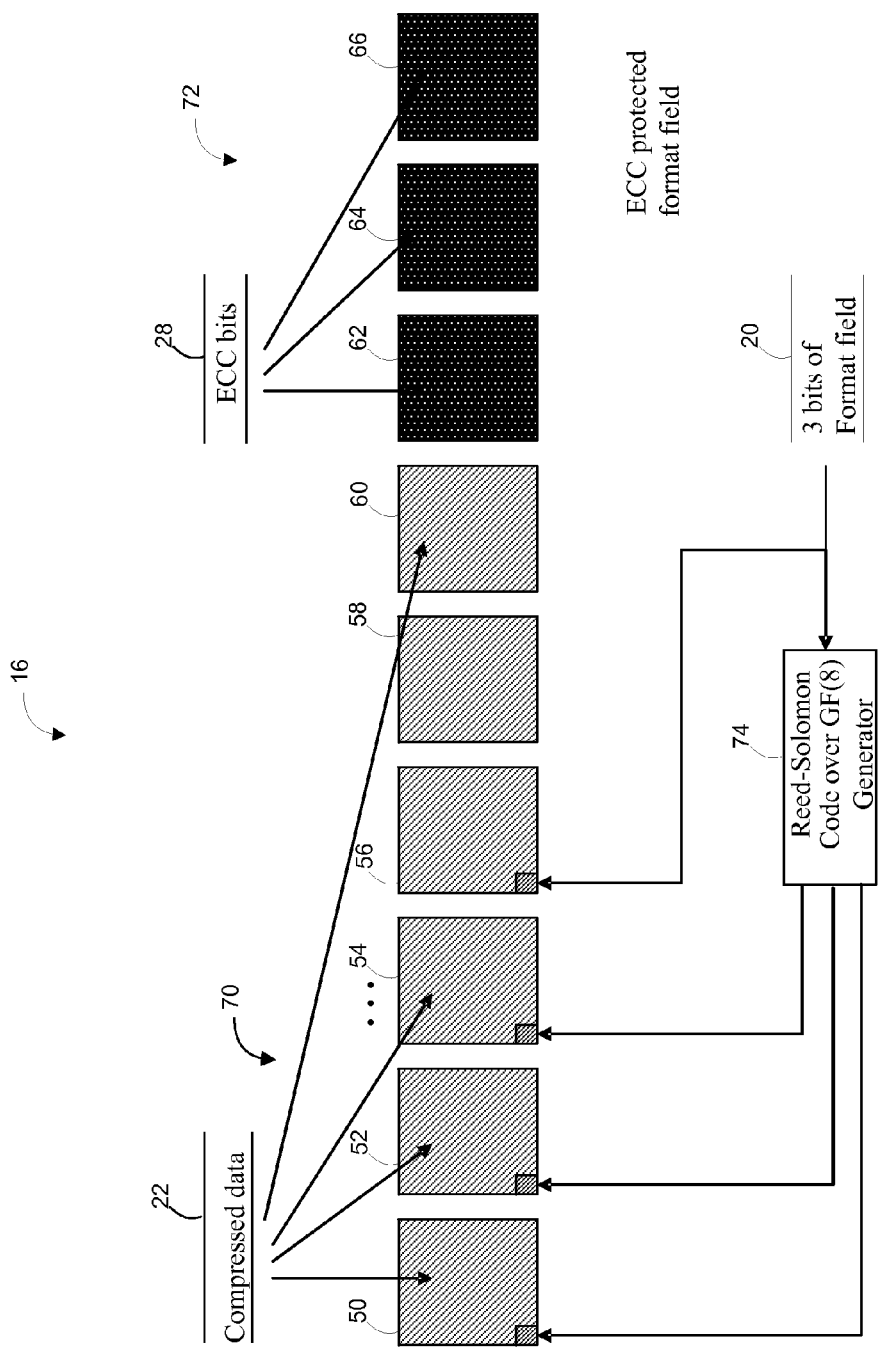
FIG. 4 is a block diagram illustrating memory chips and the disbursement of a line of data across the memory chips in accordance with an exemplary embodiment.

The memory manager module 38 receives as input the line of data 18. The memory manager module 38 stores the line of data 18 in the memory 16. In one example, as shown in FIG. 4, the line of data is stored within a plurality of memory chips 50-66. The compressed data 22 of the line of data 18 is stored in a first subset 70 of the plurality of chips 50-66. The ECC bits 28 are stored in a second subset of the plurality of chips 50-66. The format field 20 is distributed across a plurality of the first subset 70 of the plurality of chips 50-66. This allows the format field 20 to be decoded independently from the rest of the data and provides more reliable decoding due to the fact that a chip failure may only affect a relatively small portion of the format field 20.

In one example, the format field 20 may be comprised of three bits indicating a total of eight possible levels of compressibility for the line of data 18. By regarding these three bits as a symbol in GF (8), a GF (8) check symbol from a Reed Solomon code generator 74 can be produced. A total of four symbols (one for the format field, three for the associated redundant checks) can be stored each on a different chip 50-66. The resulting Reed Solomon code is capable of collecting any single symbol error and detecting any two symbol errors. Therefore, when a single chip failure occurs the format field can still be recovered. When any two chip failures occur, an uncorrectable error is recognized, and a miss-correction is prevented.

Figure 5:
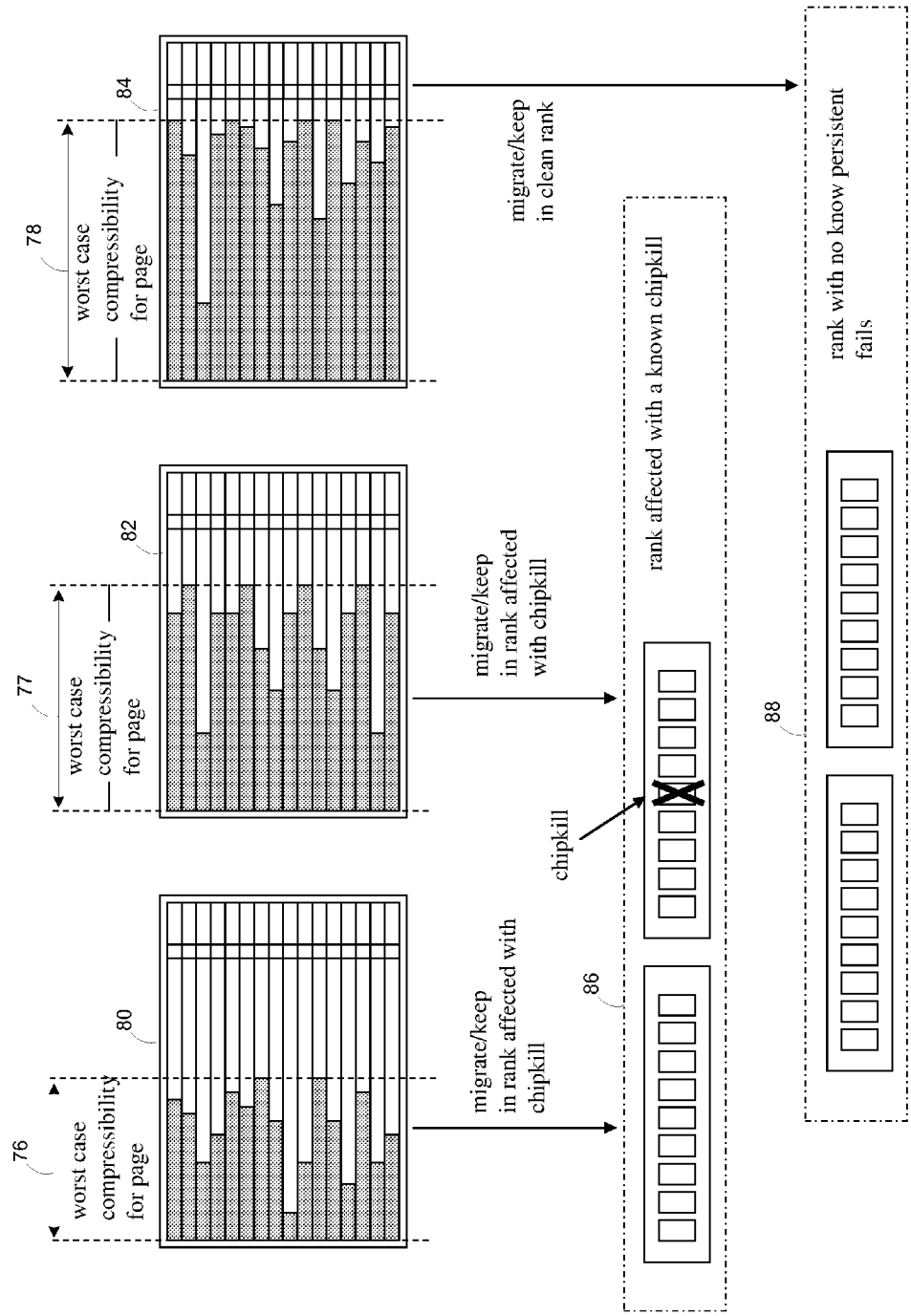
FIG. 5 is a block diagram illustrating pages including the lines of data and a compressibility score in accordance with an exemplary embodiment.
Figure 6:
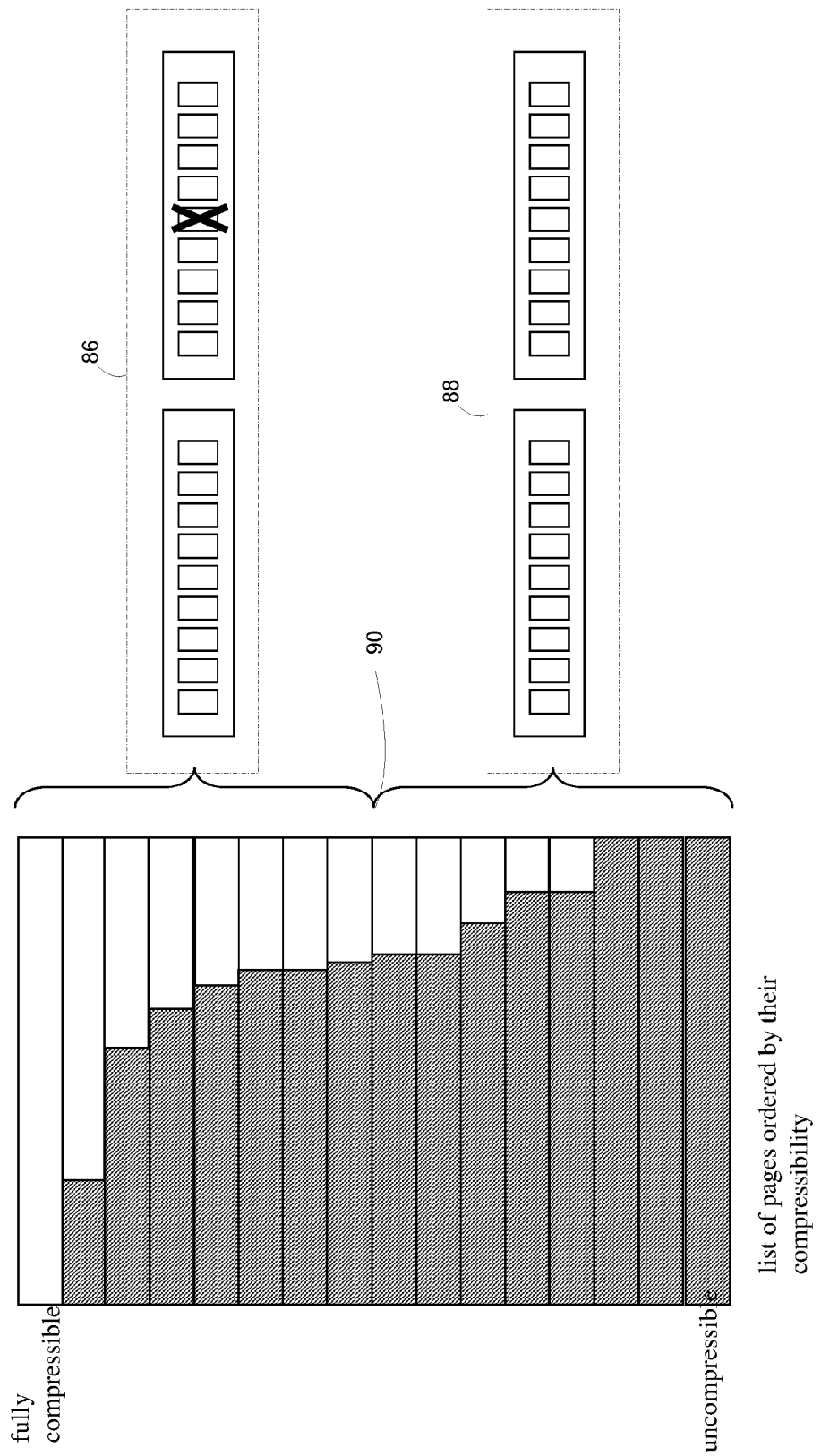
FIG. 6 is a block diagram further illustrating a page including the lines of data and a compressibility threshold in accordance with an exemplary embodiment.

In various embodiments, the memory manager module 38 provides further protection of the data 44 based on the compressibility of the data 44 within a page. A page is a logical concept that an operative system relies on for its memory management. Information about pages is maintained by a page table which is generally responsible for mapping addresses of virtual memory and addresses of physical memory. In one example, as shown in FIGS. 5 and 6, the memory manager module 38 estimates a compressibility score 76-78 for each page in a page table (as exemplified with pages 80-84) based on an average of the compressibility of the lines of data on the page, the worst case compressibility of the lines of data on the page (as shown in FIG. 3), and/or any other suitable compressibility measures. The memory manager module 38 then orders the pages 80-84 based on their compressibility score 76-78 as shown in FIG. 6.

In one example, the pages 80-84 with a high compressibility score are then mapped to memory ranks 86 that indicate a low quality of memory, such as, for example, memory ranks 86 that are affected by a chip failure. A memory rank is comprised of one or more chips that are accessed in parallel during reads and writes. The reliability of memory includes a description of the reliability scores of various memory ranks in a memory. The page tables 80-84 with a low compressibility score are mapped to memory ranks 88 that indicate a high quality of memory, such as, for example, memory ranks 86 that are not affected by a chip failure. Performing the mapping includes migration of pages from a section of memory to a different section of memory which involves copying the corresponding data and adjusting the page table to reflect the remapping.

In various embodiments, the memory manager module 38 determines the high compressibility score and the low compressibility score based on a predetermined compressibility threshold 90. In various embodiments, the memory manager module 38 determines the low quality of memory and the high quality of memory based on a reliability score. The memory manager module 38 determines the reliability score based on, for example, a number of symbols in the ECC words stored in a memory rank that are known to be bad (or with errors). The higher the number of bad symbols, the lower the reliability score. The reliability score can be compared to a predetermined reliability threshold to determine the low reliability score (less than the threshold) and the high reliability score (higher than the threshold). As can be appreciated, various other methods of determining high quality and low quality or reliability of the memory can be employed by the memory manager module 38.

Turning back to FIG. 3, when the data is to be retrieved from memory, the data decoder module 40 retrieves from the memory 16 the line of data 18. The data decoder module 40 decodes the line of data 18 to correct for any errors if possible and generate the format field 20 and the compressed data 22. In various embodiments, the data decoder module 40 decodes the line of data 18 by first decoding the format field 20 to determine how well the line is compressed and, hence, how many ECC bits 28 exist to protect the overall line of data 18. If the decoder module 40 finds an uncorrectable error while decoding the format field 20, then a flag 92 is generated to notify a requester of the data 44 of the condition. When the format field 20 does not have an uncorrectable error, the data decoder module 40 proceeds to decode the remainder of the line of data 18. The data decoder module 40 makes use of the ECC bits 28 to improve the error correction and detection capability.

The decompression module 42 receives as input the compressed data 22. The decompression module 42 decompresses the compressed data 22 according to one or more decompression techniques known in the art. The results of the decompression are generated by the decompression module 42 as the data 44. Any errors encountered during the decompression of the compressed data are provided to the requestor as flags 94.

Figure 7:
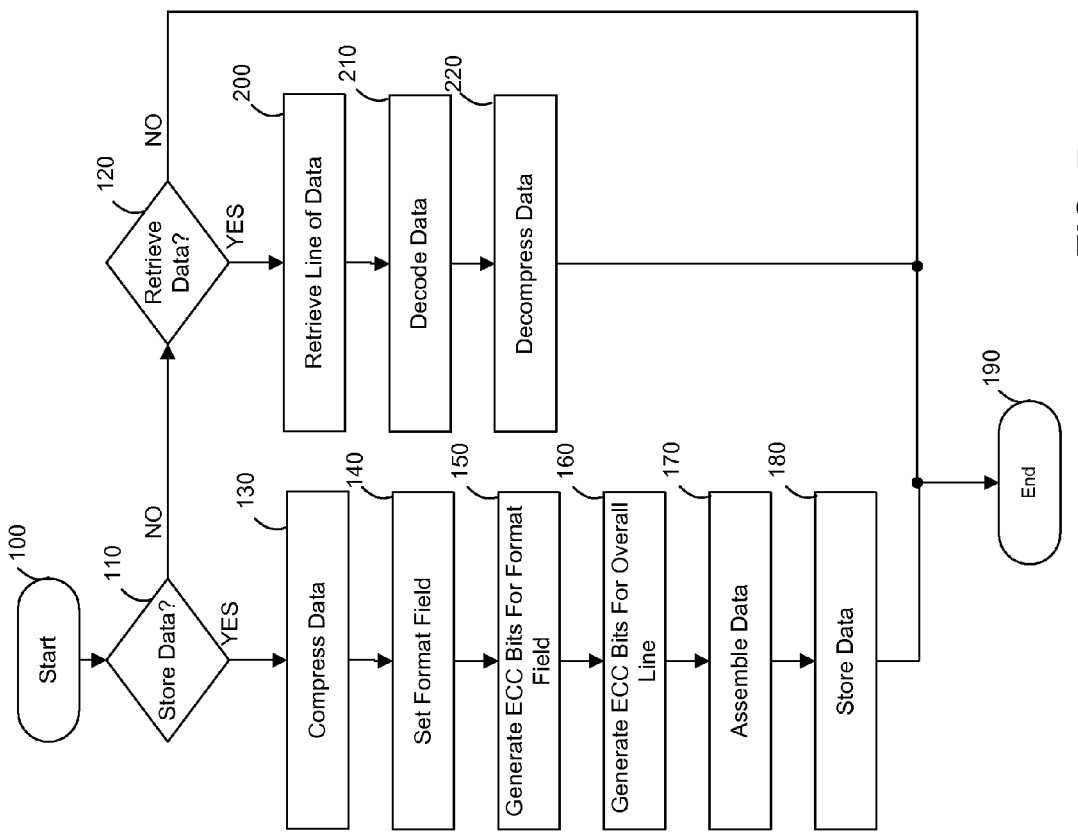
FIG. 7 is a flowchart illustrating a data protection method in accordance with an exemplary embodiment.

Turning now to FIG. 7 and with continued reference to FIG. 3, a flowchart illustrates a data protection method that can be performed by the data protection system 12 of FIG. 3 in accordance with an exemplary embodiment. As can be appreciated in light of the disclosure, the order of operation within the method is not limited to the sequential execution as illustrated in FIG. 7, but may be performed in one or more varying orders as applicable and in accordance with the present disclosure.

In one example, the method may begin at 100. The data operation is evaluated at blocks 110 and 120. If the data operation indicates that the data 44 is to be stored at block 110, the data 44 is sent to the compression module 30 and compressed at block 130. Based on the degree of compressibility 46 of the data 44, the number of free ECC bits to be stored in the format field 20 is determined at block 140. The ECC bits 28 for the compressed data 22 are generated and stored in the format field 20 at block 150 and the ECC bits 28 for the format field 20 together with the compressed data 22 are generated at block 160. Thereafter, the format field 20, the compressed data 22, and the ECC bits 28 are assembled into the line of data 18 at block 170. The line of data 18 is stored in the memory 16 at block 180 as will be discussed in more detail with regard to FIGS. 8 and 9. Thereafter, the method may end at block 190.

If, however, the data operation indicates that the data 44 is not to be stored at block 110, rather, the data 44 is to be retrieved at block 120, the line of data 18 is retrieved from the memory 16 at block 200. The line of data 18 is decoded at block 210 and the compressed data 22 is decompressed at block 220. Thereafter, the method may end at block 190.

Figure 8:
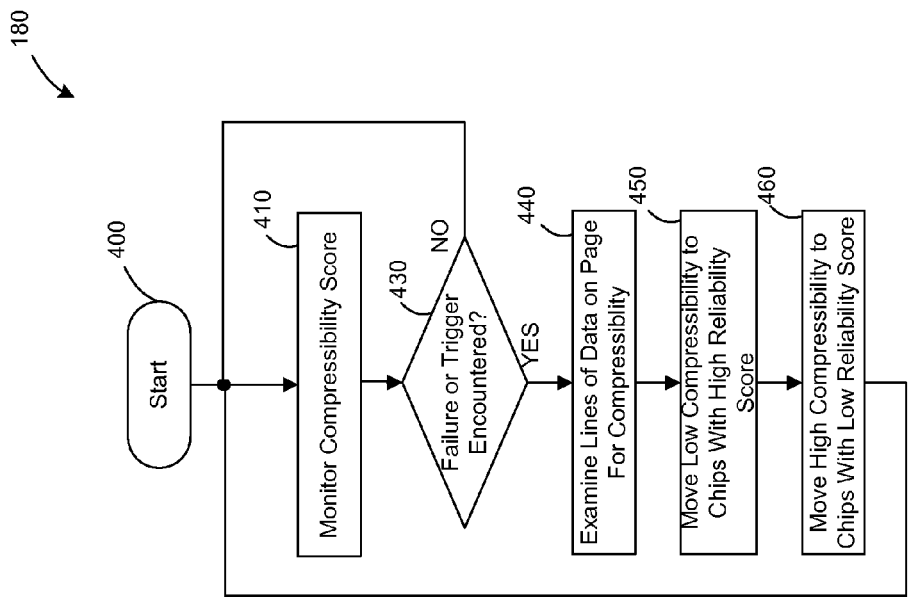
FIG. 8 is a flowchart illustrating a data storing method of the data protection method in accordance with an exemplary embodiment.

Turning now to FIG. 8 and with continued reference to FIG. 3, a flowchart illustrates a data storing method 180 of the data protection method that can be performed by the data protection system 12 of FIG. 3 in accordance with an exemplary embodiment. As can be appreciated in light of the disclosure, the order of operation within the method is not limited to the sequential execution as illustrated in FIG. 8, but may be performed in one or more varying orders as applicable and in accordance with the present disclosure.

In one example, the method may begin at 400. In this example, it is assumed that each line of data 18, regardless of the compressibility, is allocated a minimum number of ECC bits 28 that will allow the line of data 18 to survive a first instance of a memory failure. At block 410, the data protection system 12 continuously monitors the compressibility score 76-78 of each page 80-84 in the computing system 10 (FIG. 1). When a persistent failure is encountered (and corrected) in a region of memory or a trigger event, such as a scheduled time, occurs at block 430, the pages 80-84 residing in that region of the memory 16 are examined for their compressibility at block 440. Those pages that do not compress well (compressibility score less than the compressibility threshold 90 (FIG. 6)) are then migrated to the physical memory occupied by those highly compressible pages that reside on memory sections with a high reliability score at block 450. In turn, these highly compressible pages are migrated to the region of memory with the low reliability score, for example, the region of memory that is affected with the persistent failure recently discovered at block 460. The operation of migration of pages is a well understood concept in computing systems architecture and can be implemented using the virtual memory system of an operative system.

The process of monitoring and migration of pages continues after a persistent failure is encountered, as the system will update memory contents and thus their compressibility may change over time. In general, the policy to be followed is to interchange the physical location of two pages depending on their relative compressibility and the relative extent of the failure of the physical memory in which these pages reside. If it is encountered that too many fails have affected the system or that there are not enough compressible pages to maintain a minimum standard of reliability in the overall system, a notification can be generated indicating this condition so that proper actions can be taken to improve the condition. Technical effects of the present disclosure includes improvements to the overall reliability of a system by taking advantage of the fact that memory contents are often compressible in a lossless manner.

Figure 9:
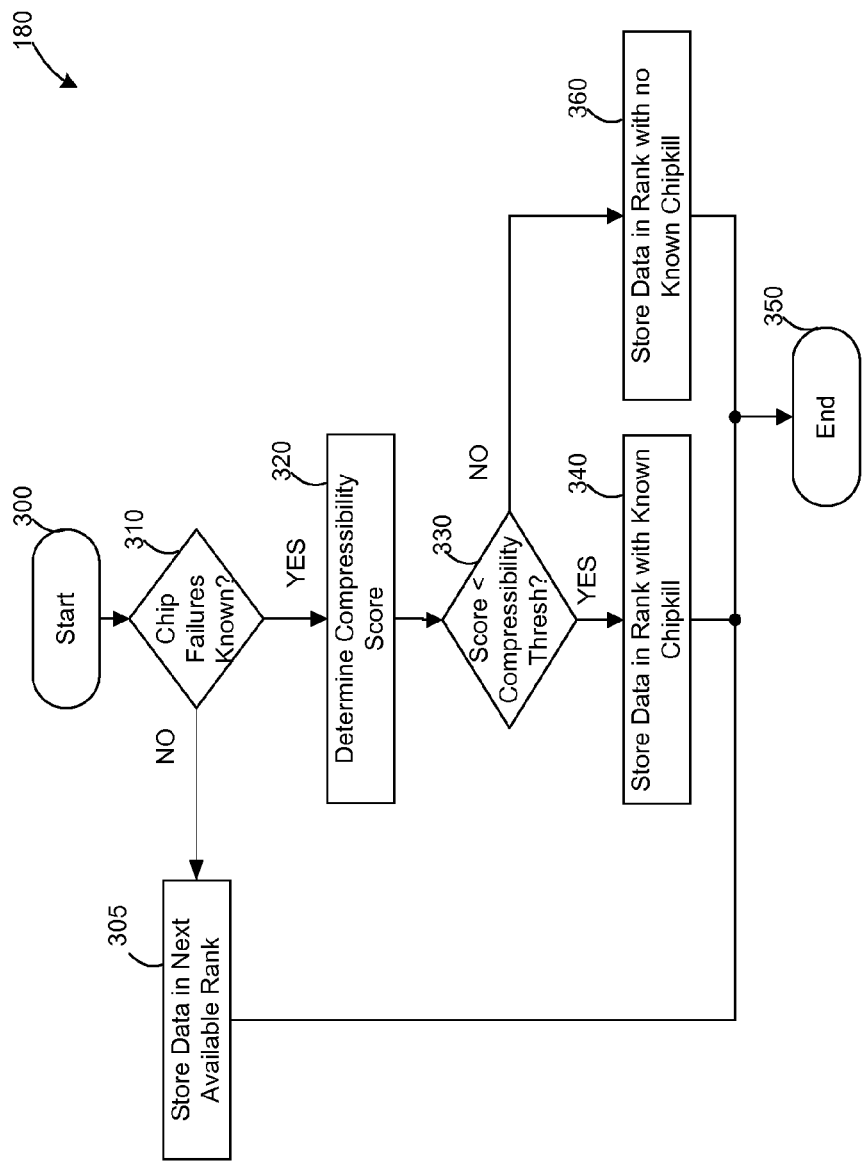
FIG. 9 is a flowchart illustrating a data storing method of the data protection method in accordance with an exemplary embodiment.

Turning now to FIG. 9 and with continued reference to FIG. 3, a flowchart illustrates a data storing method 180 of the data protection method that can be performed by the data protection system 12 of FIG. 3 in accordance with an exemplary embodiment. As can be appreciated in light of the disclosure, the order of operation within the method is not limited to the sequential execution as illustrated in FIG. 9, but may be performed in one or more varying orders as applicable and in accordance with the present disclosure.

In one example, the method may begin at 300. The memory 16 is evaluated for chip failures at block 310. If no chip failures are known at block 310, the line of data 18 is stored in the next available rank 86 at block 305. If, however, chip failures are known at block 310, the compressibility score 76 (FIG. 5) is determined at block 320 and evaluated at block 330. If the compressibility score 76 (FIG. 5) is less than the compressibility threshold 90 (FIG. 6) at block 330, the line of data is stored in the rank 86 with the known chip failure. Thereafter, the method may end at block 350.

If, however, the compressibility score 76 (FIG. 5) is greater than or equal to the compressibility threshold 90 (FIG. 6) at block 330, the line of data 18 is stored in the rank 88 (FIG. 5) with no known chip failure at block 360. Thereafter, the method may end at block 350.

As can be appreciated, the capabilities of the present invention can be implemented in software, firmware, hardware, or some combination thereof.

As one example, one or more aspects of the present disclosure can be included in an article of manufacture (e.g., one or more computer program products) having, for instance, computer usable media. The media has embodied therein, for instance, computer readable program code means for providing and facilitating the capabilities of the present disclosure.

The article of manufacture can be included as a part of a computer system or provided separately.

Additionally, at least one program storage device readable by a machine, tangibly embodying at least one program of instructions executable by the machine to perform the capabilities of the present disclosure can be provided.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this disclosure, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

While a preferred embodiment has been described, it will be understood that those skilled in the art, both now and in the future, may make various improvements and enhancements which fall within the scope of the claims which follow. These claims should be construed to maintain the proper protection for the disclosure first described.

The terminology used herein is for the purpose of describing particular embodiments only and is not intended to be limiting of the invention. As used herein, the singular forms "a", "an" and "the" are intended to include the plural forms as well, unless the context clearly indicates otherwise. The corresponding structures, features, materials, acts, and equivalents of all means or step plus function elements in the claims below are intended to include any structure, material, or act for performing the function in combination with other claimed elements as specifically claimed. The disclosure has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A data protection method, the method comprising:
   receiving data;
   generating compressed data based on the data;
   determining a degree of compressibility based on the compressed data;
   determining an amount of free space based on the degree of compressibility;
   providing an indicator of a number of one or more error control bits; and
   setting the one or more error control bits based on the amount of free space, the compressed data and the indicator.

2. The method of claim 1 further comprising:
   assembling the compressed data, the one or more error control bits, and the indicator into a line of data; and
   storing the line of data in memory.

3. The method of claim 2 wherein the storing the line of data comprises:
   storing the compressed data on a first set of memory chips within the memory;
   storing the one or more error control bits on a second set of memory chips within the memory; and
   storing the indicator on a third set of memory chips within the memory.

4. The method of claim 3 wherein the third set of memory chips includes one or more memory chips from the first set of memory chips.

5. The method of claim 2 further comprising:
   retrieving the line of data from memory;
   decoding the line of data retrieved from memory based on the indicator and the one or more error control bits; and
   decompressing the decoded line of data.

6. A data protection system, the system comprising a memory and a processor, the system comprising:
   a compression module that receives data to be stored in the memory, and that generates compressed data based on the data;
   a format field generator module that determines a degree of compressibility based on the compressed data, and that determines an amount of flee space based on the degree of compressibility, and that generates an indicator of a number of one or more error control bits based on the amount of free space; and
   an error bit generator module that sets one or more error control bits based on the amount of free space, the compressed data and the indicator.

7. The system of claim 6 further comprising an assembler module that assembles the compressed data, the one or more error control bits, and the indicator into a line of data.

8. The system of claim 7 further comprising a memory manager module that stores the line of data in the memory.

9. The system of claim 8 wherein the memory manager module stores the compressed data on a first set of memory chips within the memory; stores the one or more error control bits on a second set of memory chips within the memory; and stores the indicator on a third set of memory chips within the memory.

10. The system of claim 9 wherein the third set of memory chips includes one or more memory chips from the first set of memory chips.

11. The system of claim 8 further comprising a data decoder module that retrieves the line of data from memory and decodes the line of data retrieved from memory based on the indicator and the one or more error control bits.

12. The system of claim 11 further comprising a decompression module that decompresses the decoded line of data.

* * * * *